(12) United States Patent
Jang et al.

(10) Patent No.: US 7,193,906 B2
(45) Date of Patent: Mar. 20, 2007

(54) VOLTAGE REGULATING CIRCUIT AND METHOD OF REGULATING VOLTAGE

(75) Inventors: Ji Eun Jang, Seongnam-Shi (KR); Kee Teok Park, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/008,672

(22) Filed: Dec. 10, 2004

(65) Prior Publication Data
US 2005/0174864 A1 Aug. 11, 2005

(30) Foreign Application Priority Data
Feb. 6, 2004 (KR) .................. 10-2004-0008025

(51) Int. Cl.
*G11C 5/14* (2006.01)
(52) U.S. Cl. .................. 365/189.09; 365/226
(58) Field of Classification Search ......... 365/189.09, 365/226; 327/640–541; 232/277, 280
See application file for complete search history.

(56) References Cited

U.S. PATENT DOCUMENTS 6,496,027 B1 * 12/2002 Sher et al. ............. 324/763
6,535,435 B2 * 3/2003 Tanaka et al. ......... 365/189.09
6,756,805 B2 * 6/2004 Sher et al. ............. 324/765

FOREIGN PATENT DOCUMENTS

KR 100265994 6/2000

* cited by examiner

*Primary Examiner*—Gene N. Auduong
(74) *Attorney, Agent, or Firm*—Lowe Hauptman & Berner, LLP

(57) ABSTRACT

Provided is concerned with a voltage regulation circuit and method of regulating the voltage, including a reference voltage generator for generating a reference voltage by dividing a core voltage of a semiconductor memory device, a controller for controlling the reference voltage generator to adjust the reference voltage without handling the core voltage in response to a test signal of a test mode, and a voltage generator for generating a bit-line precharging voltage and/ or a cell plate voltage in accordance with the reference voltage.

10 Claims, 3 Drawing Sheets

VOLTAGE REGULATING CIRCUIT AND METHOD OF REGULATING VOLTAGE

BACKGROUND

1. Field of the Invention

The present invention is related to a voltage regulation circuit and method of regulating the voltage and particularly, to a voltage regulation circuit and method of regulating the voltage, capable of generating an optimized bitline precharge voltage and cell plate voltage with regulating a reference voltage without handling the core voltage by controlling a reference voltage generator to adjust the reference voltage in response to a control signal in a test mode.

2. Discussion of Related Art

A bitline precharge voltage is connected to a bitline and used to initialize the bitline in a standby mode of a DRAM, while a cell plate voltage is connected to a plate of a capacitor of a DRAM cell and used to restrain a leakage current by reducing a difference of voltage levels crossing both ends of a cell transistor.

FIG. 1 is a diagram of a conventional voltage regulating circuit generating the bitline precharge voltage and the cell plate voltage.

A reference voltage generator 11 composed of first and second resistors, R11 and R12, in the same size generates a reference voltage Vref of (½)VCORE by dividing a core voltage VCORE during an active mode. A bitline precharge voltage generator 12 and a cell plate voltage generator 13 input the reference voltage Vref and each output a bitline precharge voltage VBLP and a cell plate voltage VLP.

With the bitline precharge voltage generator 12 and the cell plate voltage generator 13, the reference voltage Vref is variable when the core voltage VCORE changes, which makes the bitline precharge voltage VBLP and the cell plate voltage VLP be variable. However, there is a disadvantage that is not able to adjust the bitline precharge voltage VBLP and the cell plate voltage VLP when the core voltage VCORE maintains a constant voltage level.

SUMMARY OF THE INVENTION

The present invention is directed to a voltage regulation circuit and method of regulating the voltage, capable of regulating a bitline precharging voltage and cell plate voltage with regulating a reference voltage without handling the core voltage by controlling a reference voltage generator in response to a control signal in a test mode.

One aspect of the present invention is to provide a voltage regulating circuit comprising: a reference voltage generator outputting a reference voltage from dividing a core voltage of a semiconductor memory device; a controller operating the reference voltage generator to regulate the reference voltage in compliance with a test signal in a test mode without adjusting the core voltage; and a voltage generator outputting a bitline precharge voltage and/or a cell plate voltage variable in response to the reference voltage.

The reference voltage generator makes the reference voltage in accordance with a ratio of resistors connected n series.

The controller includes: a first transistor increasing the reference voltage by inactivating one of the resistors of the reference voltage generator, being driven responding to a first test mode signal; and a second transistor decreasing the reference voltage by inactivating the other of the resistors of the reference voltage generator, being driven responding to a second test mode signal.

Another aspect of the present invention is to provide a voltage regulating circuit comprising: a reference voltage generator outputting a reference voltage from dividing a core voltage in accordance with a ratio of resistors connected between the core voltage terminal and a ground terminal; a first transistor increasing the reference voltage by inactivating one of the resistors which is connected to the core voltage terminal without adjusting the core voltage; a second transistor decreasing the reference voltage by inactivating the other of the resistors which is connected to the ground terminal without adjusting the core voltage; and a voltage generator outputting a bitline precharge voltage and/or a cell plate voltage variable in response to the reference voltage.

Further, the present invention provides a method of regulating a voltage, comprising: generating a bitline precharge voltage and/or a cell plate voltage with using a reference voltage provided from a reference voltage generator in response to a core voltage; increasing the reference voltage by controlling the reference voltage generator in response to a first test mode signal without adjusting the core voltage and increasing the bitline precharge voltage and/or the cell plate voltage with using the increased reference voltage; and decreasing the reference voltage by controlling the reference voltage generator in response to a second test mode signal without adjusting the core voltage and decreasing the bitline precharge voltage and/or the cell plate voltage with using the decreased reference voltage.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
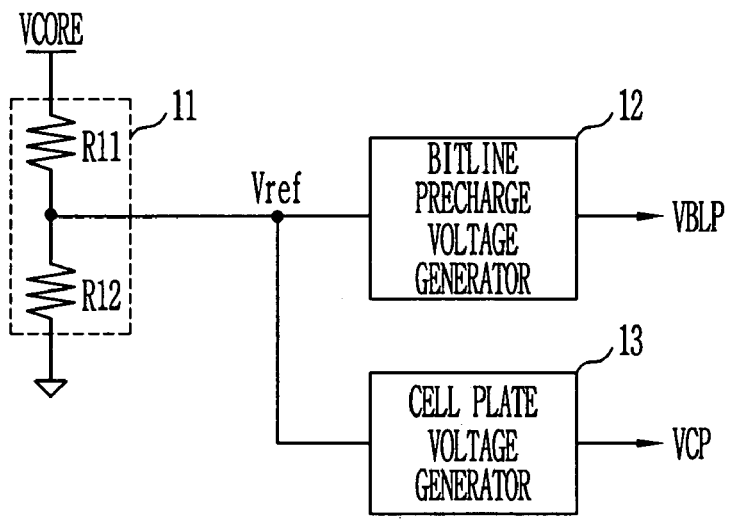
FIG. 1 is a diagram of a conventional voltage regulating circuit.
Figure 2:
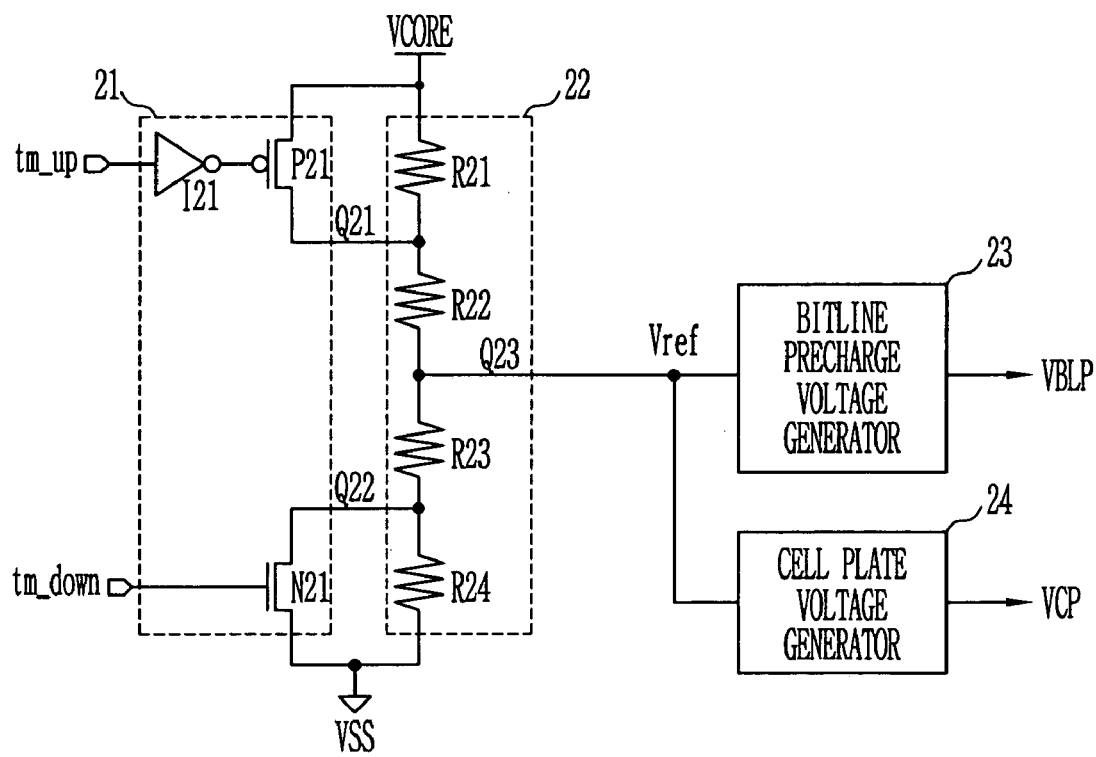
FIG. 2 is a diagram of a voltage regulating circuit in accordance with the present invention.

FIG. 2 is a diagram of a voltage regulating circuit in accordance with the present invention.

A controller 21 is composed of a PMOS transistor P21 connected between a terminal of a core voltage VCORE and a first node Q21 and driven by an output signal of an inverter 121 inversing a test mode voltage-up signal tm_up, and an NMOS transistor N21 connected between a second node Q22 and a ground terminal VSS and driven by a test mode voltage-down signal tm_down, which varies a resistance value by altering a current path from a reference voltage generator 22.

The reference voltage generator 22 is constructed of plural resistors, e.g., first through fourth resistors R21~R24, establishing a reference voltage Vref at a third node Q23 in accordance with resistance ratios of the first and second resistors, R21 and R22, and of the third and fourth resistors R23 and R24. Here, the sum of the first and second resistors R21 and R22 is as same as that of the third and fourth resistors R23 and R24. The reference voltage Vref is variable because the first or fourth resistor, R21 or R24, can be inactive by the controller 21.

The bitline precharge voltage generator 23 and the cell plate voltage generator 24 input the reference voltage Vref and then output the bitline precharge voltage VBLP and the cell plate voltage VCP.

It will be now described about the operation of the voltage regulating circuit for controlling the bitline precharge voltage and the cell plate voltage in accordance with the present invention.

If the test mode voltage-up signal tm_up and the test mode voltage_down signal tm_down are applied with a logical low in a normal state, the test mode voltage-up signal of a low state is inversed to a high state by an inverter I21 and thereby the PMOS transistor P21 is turned off. And, the test mode voltage-down signal tm_down of a low state turns the NMOS transistor N21 off. Thus, the reference voltage generator 22 outputs the reference voltage Vref of (½)VCORE from dividing the core voltage VCORE with the ratios of the first and second resistors R21 and R22, and of the third and fourth resistors R23 and R24. The reference voltage Vref is supplied to the bitline precharge voltage generator 23 and the cell plate voltage generator 24 to set the bitline precharge voltage VBLP and the cell plate voltage VCP those are leveled on (½)VCORE.

In elevating the bitline precharge voltage VBLP and the cell plate voltage VCP with maintaining the core voltage VCORE constant, when the test mode voltage-up signal tm_up is applied with a high state and the test mode voltage-down signal tm_down is applied with a low state, the test mode voltage-up signal of a high state is inversed to a low state by an inverter 121 and thereby the PMOS transistor P21 is turned on. And, the test mode voltage-down signal tm_down of a low state turns the NMOS transistor N21 off. As the PMOS transistor P21 is turned on, the first resistor R21 becomes inactive. The reference voltage generator 22 outputs the reference voltage Vref higher than (½)VCORE from dividing the core voltage VCORE with the ratios of the first and second resistors R21 and R22, and of the third and fourth resistors R23 and R24. The reference voltage Vref is supplied to the bitline precharge voltage generator 23 and the cell plate voltage generator 24 to set the bitline precharge voltage VBLP and the cell plate voltage VCP that are higher than (½)VCORE.

In falling the bitline precharge voltage VBLP and the cell plate voltage VCP with maintaining the core voltage VCORE constant, when the test mode voltage-up signal tm_up is applied with a low state and the test mode voltage-down signal tm_down is applied with a high state, the test mode voltage-up signal tm_up of a low state is inversed to a high state by an inverter 121 and thereby the PMOS transistor P21 is turned on. And, the test mode voltage-down signal tm_down of a high state turns the NMOS transistor N21 on. As the NMOS transistor N21 is turned on, the fourth resistor R24 becomes inactive. Thus, the reference voltage generator 22 outputs the reference voltage Vref lower than (½)VCORE from dividing the core voltage VCORE with the ratios of the first and second resistors R21 and R22, and of the third and fourth resistors R23 and R24. The reference voltage Vref is supplied to the bitline precharge voltage generator 23 and the cell plate voltage generator 24 to set the bitline precharge voltage VBLP and the cell plate voltage VCP that are lower than (½)VCORE.

Figure 3:
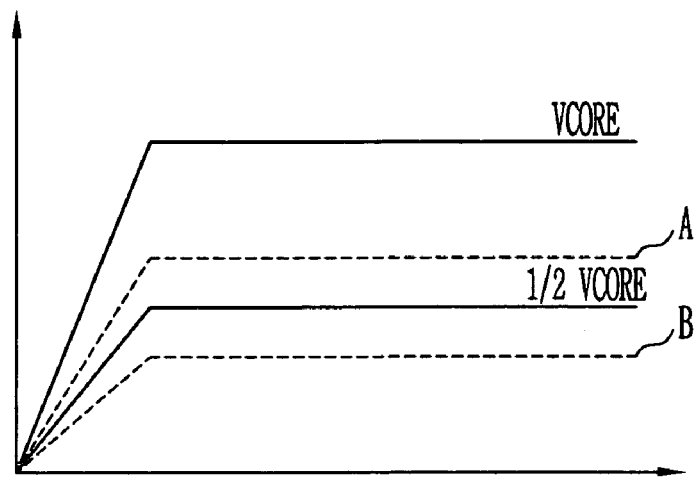
FIG. 3 is a waveform diagram of the voltage regulating circuit in accordance with the present invention.

As aforementioned, in the voltage regulating circuit according to the present invention, as shown in FIG. 3, the bitline precharge voltage VBLP and the cell plate voltage VCP are adjusted higher than (½)VCORE when the test mode voltage-up signal tm_up is applied with a high state and the test mode voltage-down signal tm_down is applied with a low state (A), while lower than (½)VCORE when the test mode voltage-up signal tm_up is applied with a low state and the test mode voltage-down signal tm_down is applied with a high state (B).

Figure 4:
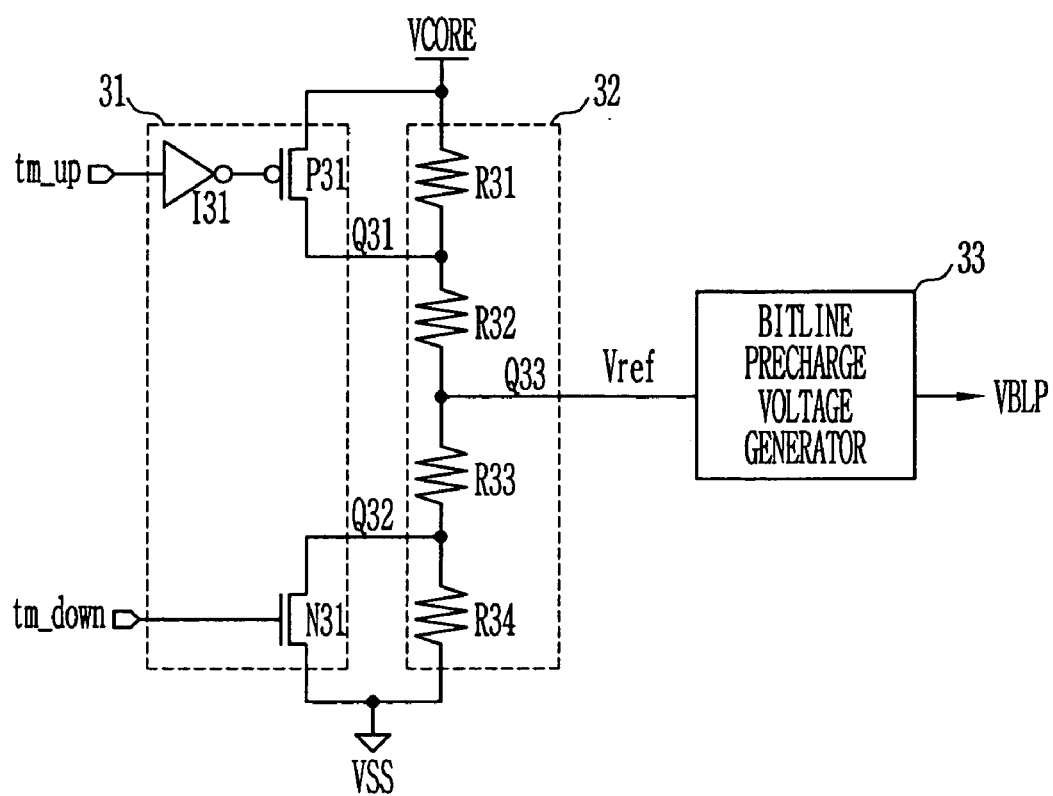
FIG. 4 is a diagram of a voltage regulating circuit in accordance with another embodiment of the present invention.

FIG. 4 is a diagram of a voltage regulating circuit in accordance with another embodiment of the present invention.

The controller 31 is composed of a PMOS transistor P31 connected between a terminal of a core voltage VCORE and a first node Q31 and driven by an output signal of an inverter 131 inversing a test mode voltage-up signal tm_up, and an NMOS transistor N31 connected between a second node Q32 and a ground terminal VSS and driven by a test mode voltage-down signal tm_down, which varies a resistance value by altering a current path from a reference voltage generator 32. The reference voltage generator 32 is constructed of plural resistors, e.g., first through fourth resistors R31~R34, establishing a reference voltage Vref at a third node Q33 in accordance with resistance ratios of the first and second resistors, R31 and R32, and of the third and fourth resistors R33 and R34. Here, the sum of the first and second resistors R31 and R32 is as same as that of the third and fourth resistors R33 and R34. The reference voltage Vref is variable because the first or fourth resistor, R31 or R34, can be inactive by the controller 31. The bitline precharge voltage generator 33 inputs the reference voltage Vref and then outputs the bitline precharge voltage VBLP.

Figure 5:
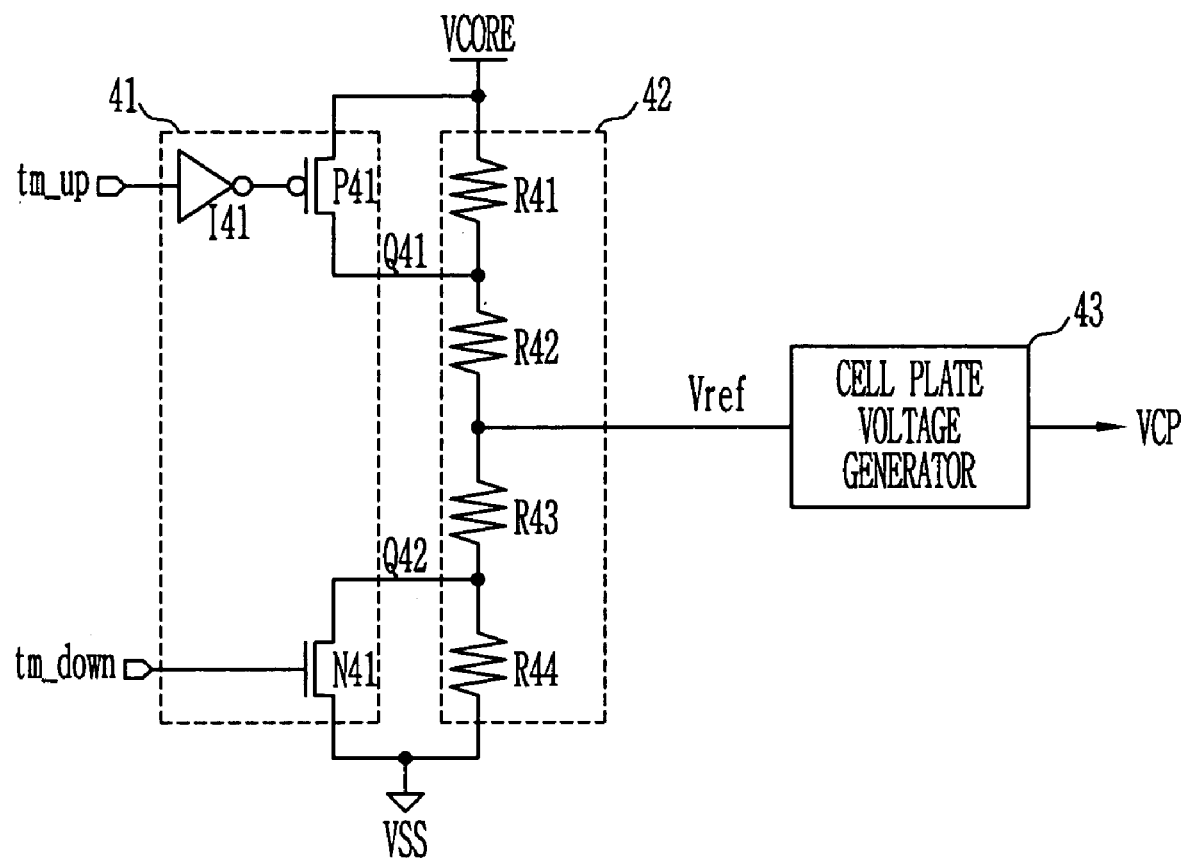
FIG. 5 is a diagram of a voltage regulating circuit in accordance with still another embodiment of the present invention.

FIG. 5 is a diagram of a voltage regulating circuit in accordance with still another embodiment of the present invention.

The controller 41 is composed of a PMOS transistor P41 connected between a terminal of a core voltage VCORE and a first node Q41 and driven by an output signal of an inverter 141 inversing a test mode voltage-up signal tm_up, and an NMOS transistor N41 connected between a second node Q42 and a ground terminal VSS and driven by a test mode voltage-down signal tm_down, which varies a resistance value by altering a current path from a reference voltage generator 42. The reference voltage generator 42 is constructed of plural resistors, e.g., first through fourth resistors R41~R44, establishing a reference voltage Vref at a third node Q43 in accordance with resistance ratios of the first and second resistors, R41 and R42, and of the third and fourth resistors R43 and R44. Here, the sum of the first and second resistors R41 and R42 is as same as that of the third and fourth resistors R43 and R44. The reference voltage Vref is variable because the first or fourth resistor, R41 or R44, can be inactive by the controller 41. The cell plate voltage generator 43 inputs the reference voltage Vref and then outputs the cell plate voltage VCP.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

As stated above, the present invention is able to adjust the bitline precharge voltage ad the cell plate voltage by regulating the reference voltage with controlling the reference generator in response to the test mode signals.

What is claimed is:

1. A voltage regulating circuit comprising:
    a core voltage terminal to which a core voltage of a semiconductor memory device is supplied;
    a reference voltage generator for outputting a reference voltage by dividing the core voltage;
    a controller for changing the reference voltage in response to a test mode voltage-up signal and a test mode voltage-down signal in a test mode without adjusting the core voltage;
    a bitline precharge voltage generator for outputting a bitline precharge voltage in response to the reference voltage; and
    a cell plate voltage generator for outputting a cell plate voltage in response to the reference voltage, and
    wherein the test mode voltage-up and voltage-down signals are independently controlled.

2. The voltage regulating circuit as set forth in claim 1, wherein the reference voltage generator makes the reference voltage in accordance with a ratio of resistors connected in series.

3. The voltage regulating circuit as set forth in claim 1, wherein the controller comprises:
    an inverter inverting the test mode voltage-up signal;
    a first transistor for increasing the reference voltage by inactivating one of the resistors of the reference voltage generator, being driven responding to an output signal of the inverter; and
    a second transistor for decreasing the reference voltage by inactivating the other of the resistors of the reference voltage generator, being driven responding to the test mode voltage-down signal.

4. The voltage regulating circuit as set forth in claim 1, wherein the reference voltage generator comprises:
    a first resistor, a second resistor, a third resistor and a fourth resistor which are connected in series between the core voltage terminal and a ground terminal, wherein the sum of the first and second resistors is same as that of the third and fourth resistors.

5. The voltage regulating circuit as set forth in claim 1, wherein the first transistor includes a PMOS transistor and the second transistor includes an NMOS transistor.

6. A voltage regulating circuit comprising:
    a core voltage terminal to which a core voltage of a semiconductor memory device is supplied;
    a reference voltage generator for outputting a reference voltage by dividing the core voltage in accordance with a ratio of resistors connected between the core voltage terminal and a ground terminal;
    an inverter inverting a test mode voltage-up signal;
    a first transistor for increasing the reference voltage by inactivating one of the resistors which is connected to the core voltage terminal in response to an inverted test mode voltage-up signal without adjusting the core voltage;
    a second transistor for decreasing the reference voltage by inactivating the other one of the resistors which is connected to the ground terminal in response to a test mode voltage-down signal without adjusting the core voltage;
    a bitline precharge voltage generator for outputting a bitline precharge voltage in response to the reference voltage; and
    a cell plate voltage generator for outputting a cell plate voltage in response to the reference voltage, and
    wherein the test mode voltage-up and voltage-down signals are independently controlled.

7. The voltage regulating circuit as set forth in claim 6, wherein the first transistor is connected between the core voltage terminal and a first node and the second transistor is connected between a second node and the ground terminal.

8. The voltage regulating circuit as set forth in claim 6, wherein the reference voltage generator comprises:
    a first resistor, a second resistor, a third resistor and a fourth resistor which are connected in series between the core voltage terminal and a ground terminal, wherein the sum of the first and second resistors is same as that of the third and fourth resistors.

9. The voltage regulating circuit as set forth in claim 6, wherein the first transistor includes a PMOS transistor and the second transistor includes an NMOS transistor.

10. A method of regulating a voltage, comprising:
    generating a bitline precharge voltage and/or a cell plate voltage with using a reference voltage provided from a reference voltage generator in response to a core voltage;
    increasing the reference voltage by controlling the reference voltage generator in response to an inverted test mode voltage-up signal without adjusting the core voltage and increasing the bitline precharge voltage and/or the cell plate voltage with using the increased reference voltage; and
    decreasing the reference voltage by controlling the reference voltage generator in response to test mode voltage-down signal without adjusting the core voltage and decreasing the bitline precharge voltage and/or the cell plate voltage with using the decreased reference voltage, and wherein the test mode voltage-up and voltage-down signals are independently controlled.

* * * * *